(12) United States Patent
Kwak

(10) Patent No.: US 12,025,673 B2
(45) Date of Patent: Jul. 2, 2024

(54) METHOD FOR DETECTING LOW VOLTAGE BATTERY CELL

(71) Applicant: LG ENERGY SOLUTION, LTD., Seoul (KR)

(72) Inventor: Jin Seop Kwak, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 122 days.

(21) Appl. No.: 17/798,721

(22) PCT Filed: Jun. 29, 2021

(86) PCT No.: PCT/KR2021/008152
§ 371 (c)(1),
(2) Date: Aug. 10, 2022

(87) PCT Pub. No.: WO2022/065636
PCT Pub. Date: Mar. 31, 2022

(65) Prior Publication Data
US 2023/0084079 A1 Mar. 16, 2023

(30) Foreign Application Priority Data
Sep. 22, 2020 (KR) .......................... 10-2020-0122552

(51) Int. Cl.
*G01R 31/392* (2019.01)
*G01R 31/36* (2020.01)
(Continued)

(52) U.S. Cl.
CPC ..... *G01R 31/3865* (2019.01); *G01R 31/3648* (2013.01); *G01R 31/392* (2019.01); *H01M 10/058* (2013.01); *H01M 10/48* (2013.01)

(58) Field of Classification Search
None
See application file for complete search history.

(56) References Cited

U.S. PATENT DOCUMENTS

2010/0090650 A1* 4/2010 Yazami ............... H01M 10/486
324/426
2010/0194398 A1 8/2010 Kawasumi et al.
(Continued)

FOREIGN PATENT DOCUMENTS

EP 3 415 938 A1 12/2018
JP 2003-157911 A 5/2003
(Continued)

OTHER PUBLICATIONS

Extended European Search Report dated Jun. 29, 2023, issued in corresponding EP Patent Application No. 21872673.5.
(Continued)

*Primary Examiner* — Jas A Sanghera
(74) *Attorney, Agent, or Firm* — Morgan, Lewis & Bockius LLP

(57) ABSTRACT

The present technology provides a method of detecting a battery cell having a low voltage defect, including: setting a reference time point when a voltage of a battery is stabilized after a shipping charge, and measuring a first voltage of a battery cell at the reference time point; measuring a second voltage of the battery cell with a temporal interval longer than a period at which a self discharge of the battery cell is suppressed; and determining whether the battery cell has a low voltage defect by comparing a difference ($\Delta$OCV) between the first voltage and the second voltage with a reference value, wherein the reference value is +3 sigma ($\sigma$) to +6 sigma ($\sigma$) in a normal distribution of a voltage drop amount obtained by the measuring of the first voltage and the measuring of the second voltage for a plurality of normal sample battery cell groups.

19 Claims, 9 Drawing Sheets

(51) Int. Cl.
  *G01R 31/385* (2019.01)
  *H01M 10/058* (2010.01)
  *H01M 10/48* (2006.01)

(56) References Cited

U.S. PATENT DOCUMENTS

| | | |
|---|---|---|
| 2012/0259569 A1 | 10/2012 | Miwa et al. |
| 2014/0368208 A1 | 12/2014 | Yamada |
| 2015/0212162 A1 | 7/2015 | Nakayama et al. |
| 2016/0268648 A1 | 9/2016 | Ueno et al. |
| 2016/0291093 A1 | 10/2016 | Matsuyama et al. |
| 2020/0168896 A1* | 5/2020 | Kumakura .......... H01M 4/0404 |
| 2020/0225290 A1* | 7/2020 | Sylvester .............. G01R 31/374 |
| 2021/0057783 A1* | 2/2021 | Guillet .................... G01H 1/00 |

FOREIGN PATENT DOCUMENTS

| | | |
|---|---|---|
| JP | 2004-247319 A | 9/2004 |
| JP | 2009-004389 A | 1/2009 |
| JP | 5172579 B2 | 3/2013 |
| JP | 5289083 B2 | 9/2013 |
| JP | 2013-220011 A | 10/2013 |
| JP | 2014-002009 A | 1/2014 |
| JP | 2014-026732 A | 2/2014 |
| JP | 5897701 B2 | 3/2016 |
| JP | 5930342 B2 | 6/2016 |
| JP | 6032485 B2 | 11/2016 |
| JP | 6176487 B2 | 8/2017 |
| KR | 10-1650041 B1 | 8/2016 |
| KR | 10-1711258 B1 | 2/2017 |
| KR | 10-1820045 B1 | 1/2018 |
| KR | 10-1873129 B1 | 6/2018 |
| KR | 10-2018-0081009 A | 7/2018 |
| KR | 10-2020-0039215 A | 4/2020 |

OTHER PUBLICATIONS

International Search Report (with partial translation) and Written Opinion dated Oct. 6, 2021 issued in corresponding International Patent Application No. PCT/KR2021/008152.

* cited by examiner

[FIG. 1]
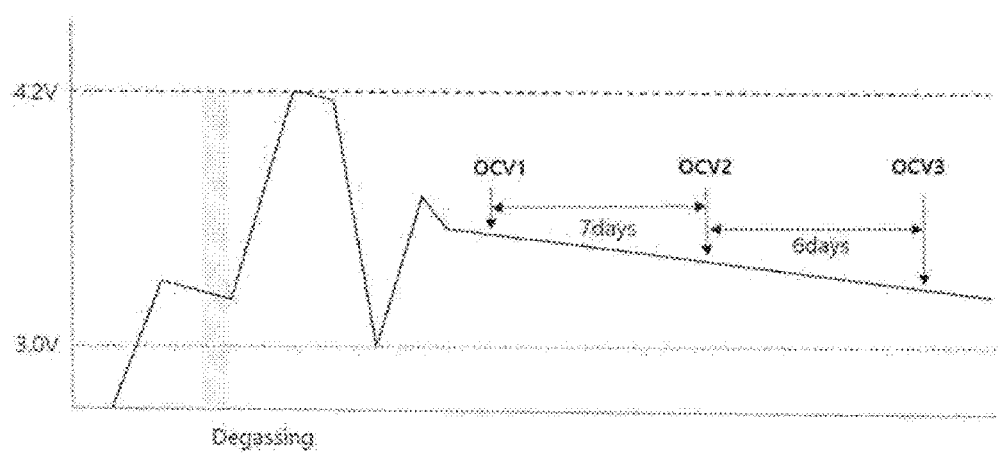

[FIG. 2]
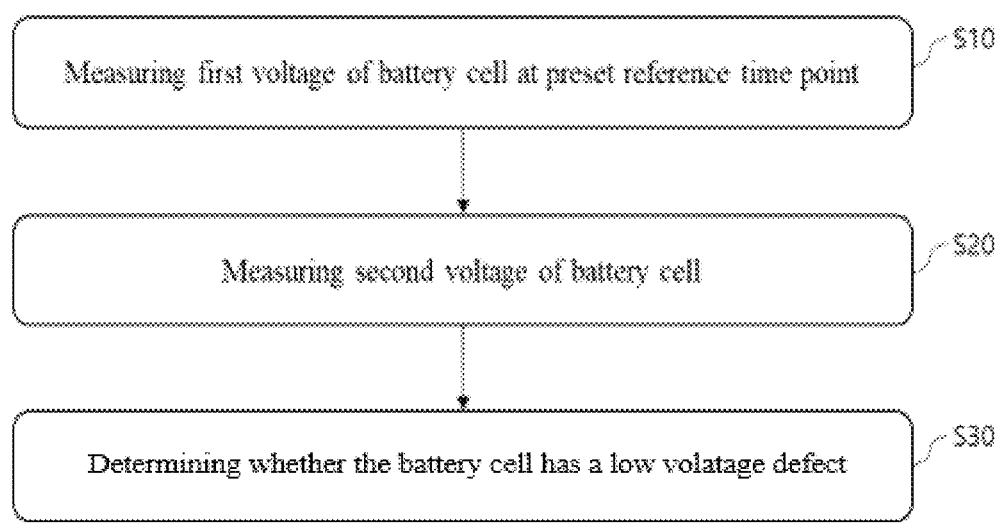

[FIG. 3]
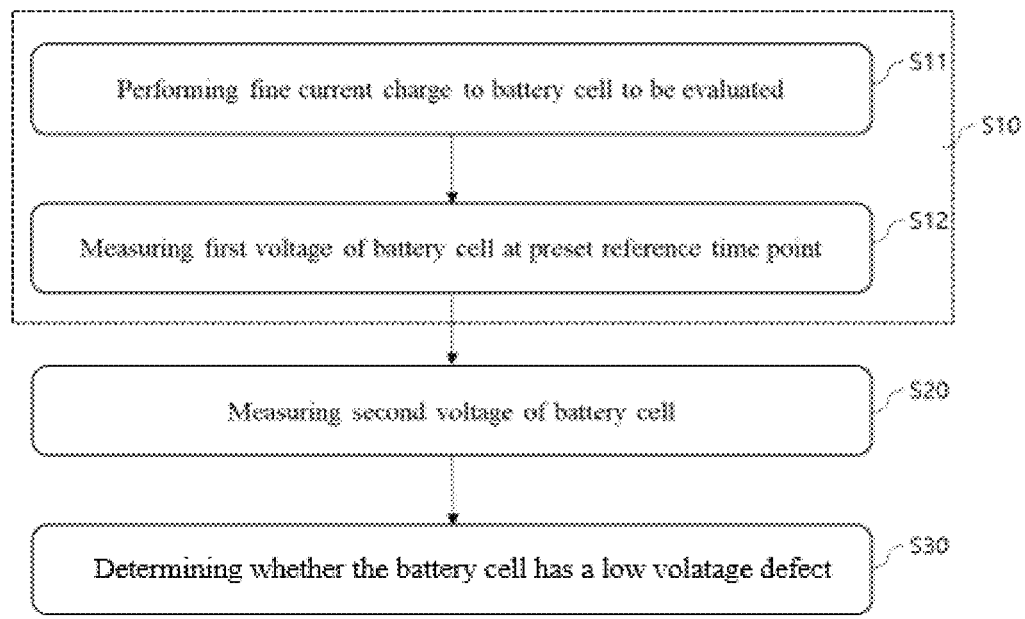

[FIG. 4]

-Related Art-

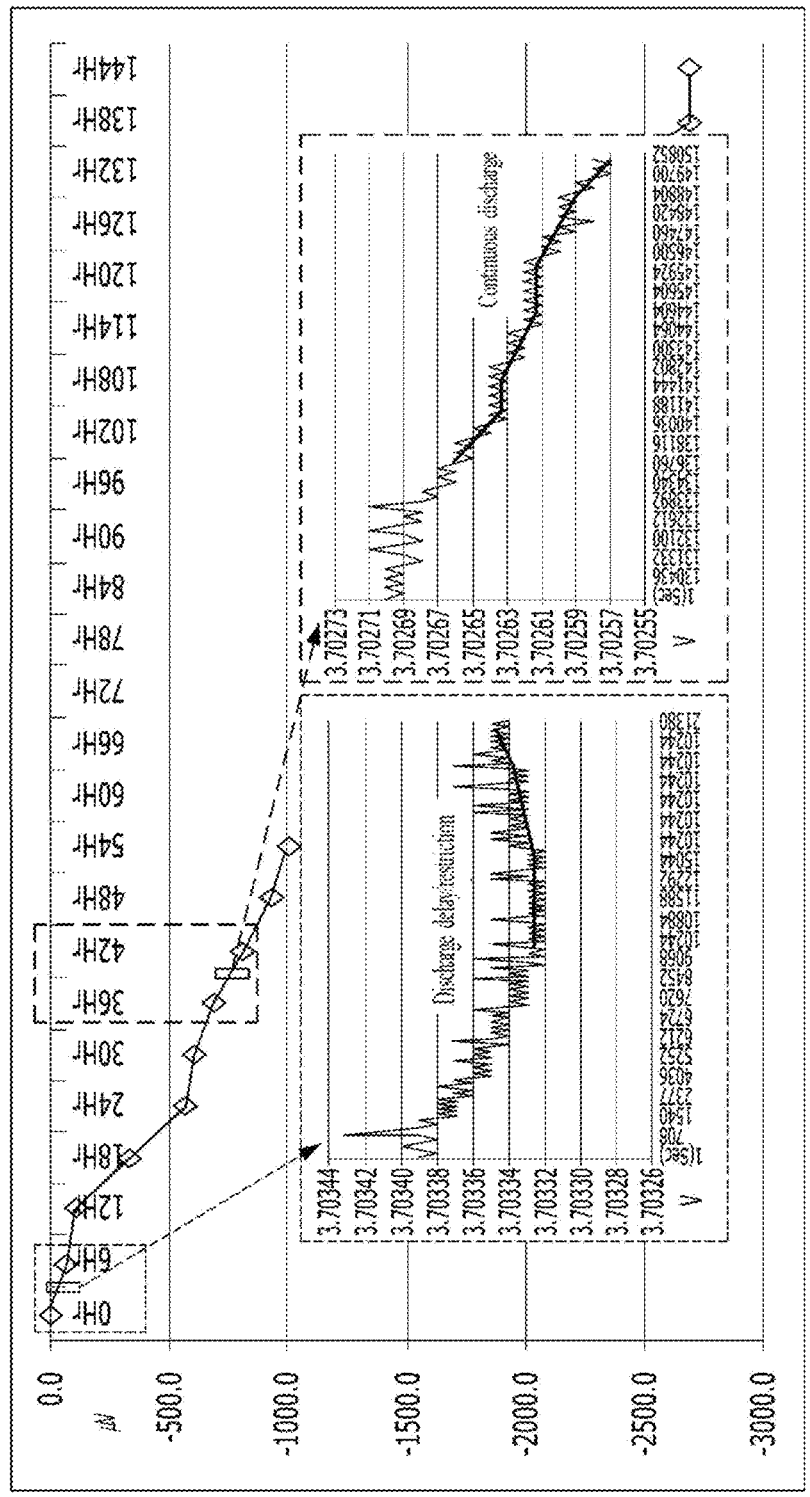
[FIG. 6]

[FIG. 7]
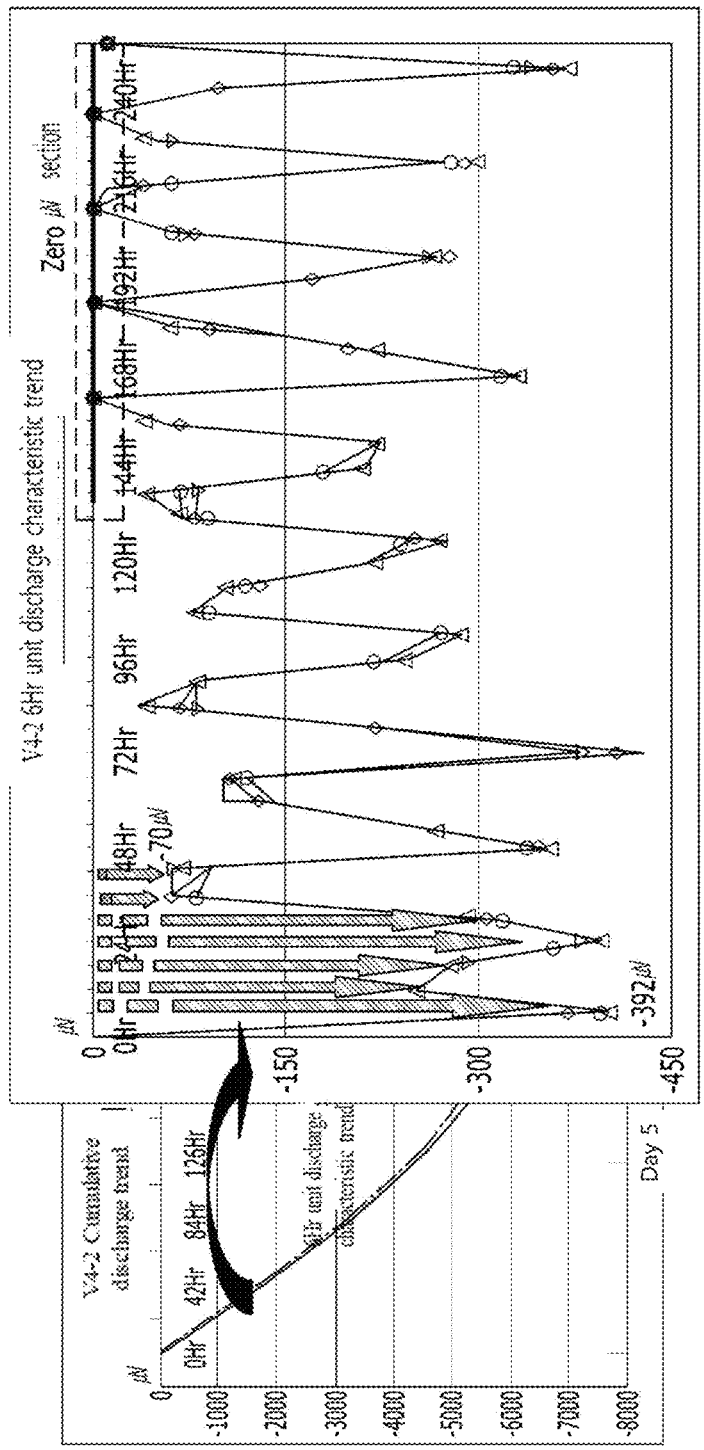

[FIG. 8]
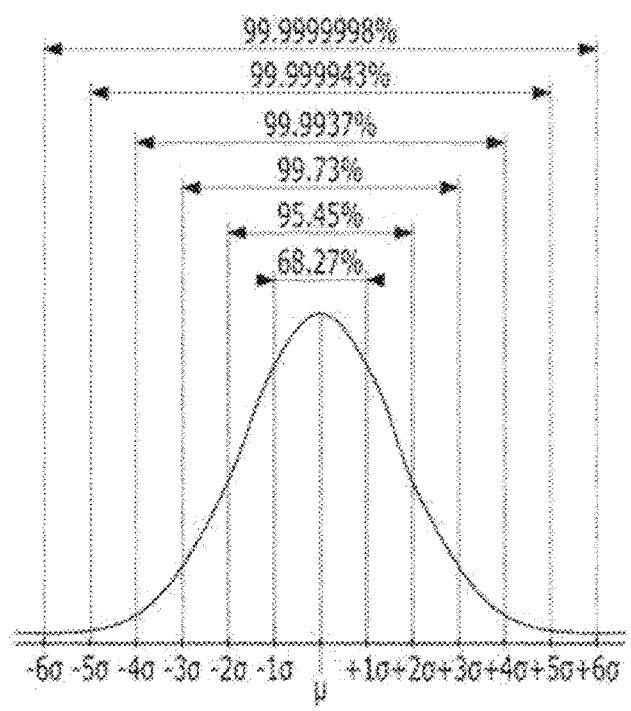

[FIG. 9]
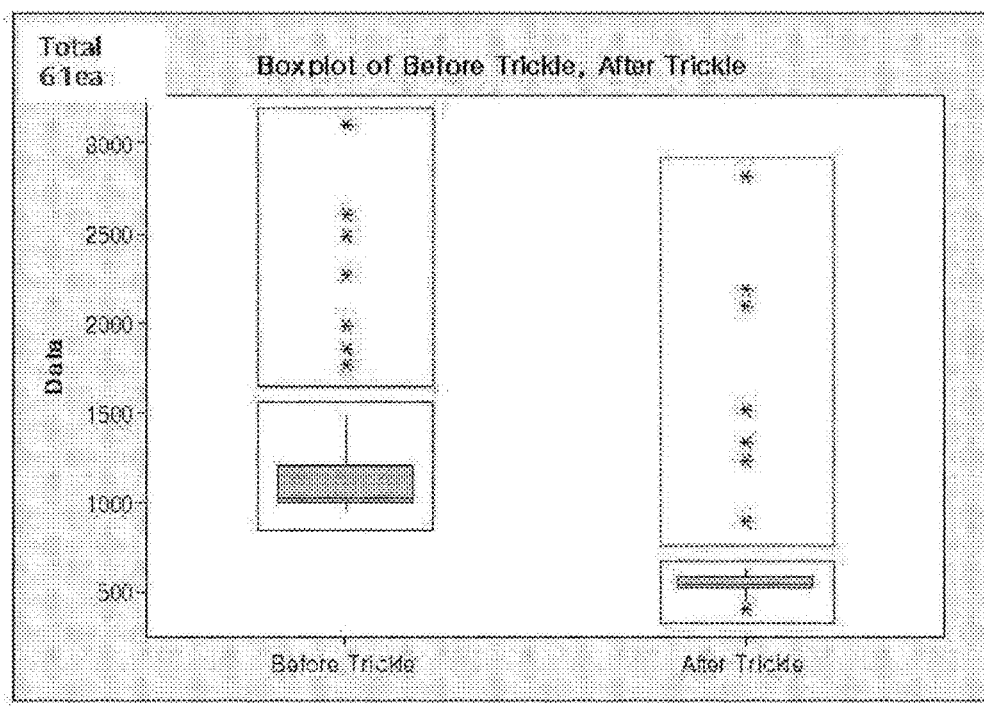

METHOD FOR DETECTING LOW VOLTAGE BATTERY CELL

TECHNICAL FIELD

This application claims the benefit of priority based on Korean Patent Application No. 10-2020-0122552, filed on Sep. 22, 2020, and the entire contents of the Korean patent application are incorporated herein by reference.

The present invention relates to a method of detecting a low voltage defect of a lithium secondary battery, and more particularly, to a method of detecting a low voltage defect of a secondary battery capable of maintaining appropriate detection power while quickly detecting a battery cell having a low voltage defect.

BACKGROUND ART

As technologies for mobile devices are developed and demand for the mobile devices increases, there has been a rapid increase in demand for secondary batteries as energy sources. Among such secondary batteries, lithium secondary batteries, which exhibit a high energy density and operational potential, a long cycle life, and a low self-discharge rate have been commercialized and widely used.

The lithium secondary battery undergoes an activation process after the electrode assembly is assembled in the battery case together with the electrolyte. The activation process stabilizes the battery structure and makes it usable through charging, aging, and discharging the assembled battery.

In the lithium secondary battery, various types of defects may occur due to various causes during a manufacturing process or use. In particular, some of secondary batteries that have been manufactured have a phenomenon of exhibiting a voltage drop behavior over a self-discharge rate, and this phenomenon is called low voltage.

The low voltage failure phenomenon of the secondary battery is often due to a foreign metal material located therein. In particular, when a metal foreign material such as iron or copper is present in the positive electrode plate of the secondary battery, the metal foreign material may grow as a dendrite at the negative electrode. In addition, such a dendrite causes an internal short circuit of the secondary battery, which may cause failure or damage of the secondary battery or, in severe cases, ignition. Therefore, the process of manufacturing a secondary battery includes a process of selecting battery cells having a low voltage defect in order to prevent the delivery of battery cells having a low voltage defect.

Further, secondary batteries, which are assembly-completed by accommodating an electrode assembly in a battery case, injecting an electrolyte solution into the battery case, and sealing the battery case, are delivered after the activation process. The activation process of the secondary battery includes a formation process of primary-charging an assembly-completed battery cell to a predetermined SOC range, an aging process of stabilizing the battery cell by storing the battery cell at a certain temperature and humidity environment, a degassing process of discharging gas inside the battery cell, a full-charging and full-discharging process, and a selection process of selecting batteries having a low voltage defect while aging the batteries after the shipping charge. Further, the process of selecting batteries having a low voltage defect after the shipping charge includes measuring voltages of shipping-charged battery cells at predetermined time intervals, recording the measured voltage values, and calculating voltage drop amounts, and determining that a battery cell has a low voltage defect if the voltage drop amount exceeds a predetermined reference value.

FIG. 1 is a schematic diagram showing a process of selecting a battery cell having a low voltage defect. Referring to FIG. 1, the process of selecting a battery cell having a low voltage defect includes comparing a voltage (OCV 1) at the time point after about 1 day from the room temperature aging time point, a voltage (OCV 2) at the time point after about 8 days from the room temperature aging time point, and a voltage (OCV 3) at the time point after about 14 days from the room temperature aging time point. Hence, it took about 14 days in selecting a battery cell having a low voltage defect. This has been understood to mean that good battery cells also have a voltage drop by a self-discharge, and in order to clearly distinguish a good product from a defective product, it takes some time.

However, about 14 days are relatively long time, and there is a need for a technology for reducing time for selecting battery cells having a low voltage defect while maintaining detection power.

The Korean Patent Publication No. 10-2020-0039215 discloses a technology for detecting a battery cell having a low voltage defect in a formation process of a pre-aged battery cell. This method has an advantage that a low voltage defect can be detected early, but since the voltage of a battery cell is monitored before a stable SEI layer is sufficiently formed through a formation process, detection power may drop due to an unstable voltage change, and the capacity defect may be simultaneously detected together with the low voltage defect, which may make it difficult to distinguish the capacity defect from the low voltage defect.

PRIOR ART LITERATURE

Patent Document (Patent Document 1) Korea Patent No. 10-2020-0039215

DISCLOSURE

Technical Problem

The present invention has been made to solve the above problems, and an object of the present invention is to reduce time required for detection of battery cells having a low voltage defect.

Further, an object of the present invention is to improve detection power to detect a battery cell having a low voltage defect by improving dispersion of the voltage drop amount of a good battery cell.

Technical Solution

A method of detecting a battery cell having a low voltage defect according to the present invention includes: setting a reference time point when a voltage of a battery is stabilized after a shipping charge, and measuring a first voltage of a battery cell at the reference time point; measuring a second voltage of the battery cell with a temporal interval longer than a period at which a self-discharge of the battery cell is suppressed; and determining whether the battery cell has a low voltage defect by comparing a difference ($\Delta OCV$) between the first voltage and the second voltage with a reference value, wherein the reference value is +3 sigma ($\sigma$) to +6 sigma ($\sigma$) in a normal distribution of a voltage drop amount obtained by the measuring of the first voltage and the measuring of the second voltage for a plurality of normal sample battery cell groups.

In an embodiment of the present invention, the reference value is +4 sigma (σ) to +5 sigma (σ) in a normal distribution of a voltage drop amount obtained by the measuring of the first voltage and the measuring of the second voltage for a plurality of normal sample battery cell groups.

In an embodiment of the present invention, during the measuring of the first voltage and the measuring of the second voltage, the voltages are measured using a voltage measuring instrument having resolution of microvolt units.

In an embodiment of the present invention, the measuring of the first voltage further includes charging a fine current after the shipping charge.

In an embodiment of the present invention, during the charging of the fine current, a current of 50 to 150 mA is applied in a CV charging scheme for 5 to 15 minutes.

In an embodiment of the present invention, the measuring of the second voltage may include measuring the second voltage of the battery cell within 15 to 72 hours from the reference time point.

In an embodiment of the present invention, the measuring of the second voltage may include measuring the second voltage of the battery cell within 18 to 45 hours from the reference time point.

In an embodiment of the present invention, the measuring of the first voltage and the measuring of the second voltage are performed at a temperature of 20 to 30° C.

A method of manufacturing a lithium secondary battery according to the present invention includes: activating an assembly-completed battery cell by injecting an electrolyte solution and sealing a battery container; and detecting a low voltage defect as described above while stabilizing the battery cell at a room temperature after a shipping charge.

In an embodiment of the present invention, the activating of the battery cell includes: forming the battery cell; aging the battery cell at a room temperature or a high temperature; discharging gas inside the battery cell; and performing a full charge and a full discharge.

Advantageous Effects

According to the method of detecting a battery cell having a low voltage defect of the present invention, time required for detecting a low voltage defect is significantly reduced, and as the voltage drop amount dispersion of good battery cells gets small, the boundary between a good product and a defective product becomes clear, thereby improving detection power.

BRIEF DESCRIPTION OF THE DRAWINGS

FIG. 1 is a schematic diagram showing the activation process including a process of checking a low voltage defect according to a conventional art.

FIG. 2 is a flowchart illustrating a method of detecting a battery cell having a low voltage defect according to an embodiment of the present invention.

FIG. 3 is a flowchart illustrating a method of detecting a battery cell having a low voltage defect according to another embodiment of the present invention.

FIG. 4 is a schematic diagram showing the activation process of the secondary battery production.

FIG. 5A shows a low voltage test method according to a conventional art, and FIG. 5B shows a low voltage test method according to the present invention.

FIG. 6 is a graph showing a cumulative discharge form and a precision voltage by monitoring a voltage drop amount at intervals of 30 seconds after OCV 1 for a good battery cell.

FIG. 7 is a graph showing a cumulative discharge form according to time after OCV 1 for a good battery cell.

FIG. 8 shows an example of a distribution curve of voltage drop amounts of a sample group according to an embodiment of the present invention.

FIG. 9 shows voltage drop amount data according to whether a fine current application charging step has been performed for a good battery cell.

DETAILED DESCRIPTION OF THE PREFERRED EMBODIMENTS

Figure 5A:
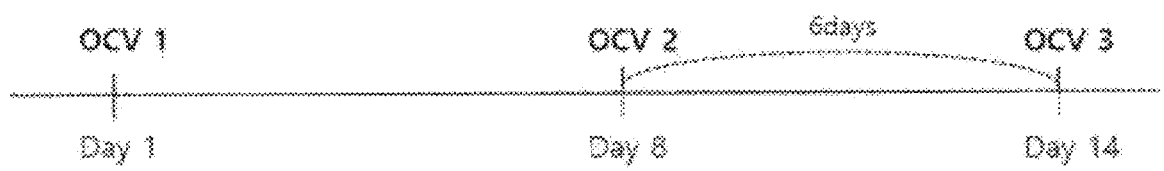
FIGS. 5A and 5B show time for low voltage test.

Hereinafter, the present invention will be described in detail with reference to the drawings. The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof. Also, when a portion such as a layer, a film, an area, a plate, etc. is referred to as being "on" another portion, this includes not only the case where the portion is "directly on" the another portion but also the case where further another portion is interposed therebetween. On the other hand, when a portion such as a layer, a film, an area, a plate, etc. is referred to as being "under" another portion, this includes not only the case where the portion is "directly under" the another portion but also the case where further another portion is interposed therebetween. In addition, to be disposed "on" in the present application may include the case disposed at the bottom as well as the top.

Hereinafter, the present invention will be described in detail with reference to the drawings.

First, an activation step of a secondary battery production will be described with reference to FIG. 4.

Referring to FIG. 4, the activation step of the secondary battery production may include a pre-aging process, a formation process, an aging process, a degassing process and a shipping-charging process.

Generally, pre-aging is a process of accommodating an electrode assembly in a battery container, injecting an electrolyte solution into the battery container, and sealing the battery container, to thereby manufacture a battery cell (i.e., bare cell). The formation is a process of initial-charging the pre-aged battery cell at preset voltage conditions (e.g., voltage of SEI film formation of negative electrode or more). The aging is a process of storing a battery cell at a preset voltage condition (e.g., 3.4 to 3.6V) and a preset temperature condition (e.g., 50 to 70 degrees) until the battery cell is stabilized to a certain state. Herein, the pre-aging process, the formation process and the aging process correspond to the wetting period. The degassing process is a process of removing unnecessary gas from the aged battery cell. For example, in the case that the secondary battery has a circular or prismatic shape, the degassing process may be omitted.

The shipping charge is a process of charging a battery cell before delivery at preset voltage conditions (e.g., SOC 20 to 50%), and preset characteristic tests (cell resistance, output, and charge/discharge capacity, etc.) may be performed for the battery cell at the shipping charge. Thereafter, after the shipping-charging process, a low voltage test is performed through an open circuit voltage (OCV) tracking scheme.

Figure 5B:
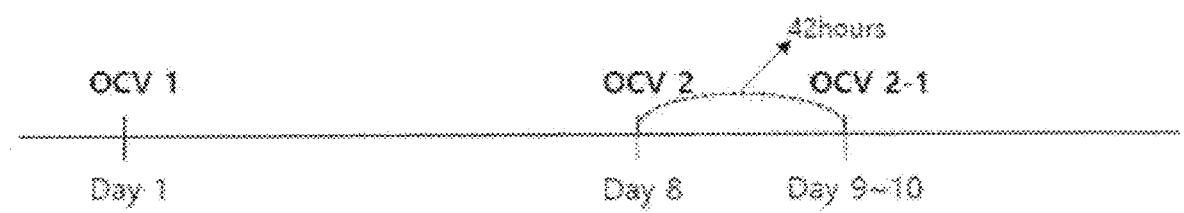

Referring to FIGS. 5A and 5B, a low voltage test of the present invention is compared with a low voltage test according to a conventional art. FIG. 5A shows a low voltage test method according to a conventional art, and FIG. 5B shows a low voltage test method according to the present invention. According to a conventional art, as shown in FIG. FIG. 5A, a six-day inspection period, which is the time interval between OCV 2 time point and OCV 3 time point, is necessary. However, the present invention is characterized in that as in FIG. 5B, the voltage is measured at the time point of OCV 2-1 much earlier than the existing time point of OCV 3, and battery cells having a low voltage defect are selected by comparing the voltage measured at the time point of OCV 2-1 with the voltage measured at the time point of OCV 2.

DETAILED DESCRIPTION OF THE PREFERRED EMBODIMENTS

Hereinafter, the reason why a low voltage detection is possible at OCV 2-1 time point in the present invention will be described with reference to FIGS. 6 and 7.

FIG. 6 is graph showing cumulative discharge form and precision voltage by monitoring the voltage drop amount at 30 second intervals after OCV 1 for good battery cells. FIG. 7 is a graph showing cumulative discharge form over time after OCV 1 for good battery cells.

First, referring to FIG. 6, after the shipping charge, the voltage of the battery cell is continually discharged as times goes by, but both continuous discharge and discharge delay/restriction occur in the fine voltage (microvolt) level.

Referring to FIG. 7, after the shipping charge, as time goes by, good battery cells come to have a 18 to 24 hour period (cycle) of discharge restriction ($\Delta OCV=0$) due to stabilization of internal resistance by sufficient aging after a certain time (in FIG. 7, after 168 hours, i.e., 7 days).

As such, the inventors of the present invention have reached the present invention in view of the point that if the voltage (first voltage) is measured at the time point (OCV 2) after 168 hours, the voltage (second voltage) is measured at the time point (OCV 2-1) with a time interval including 18 to 24 hours discharge restricting period (cycle) from the time point of measuring the voltage, and the voltage drop amount is calculated, the voltage drop amount of good battery cells is minimized, thereby making it easy to distinguish good battery cells from defective battery cells. Therefore, in the present invention, it is important to set OCV 2 time point and OCV 2-1 time point which are voltage measuring time points which become the basis in calculating the voltage drop amount.

FIG. 2 is a flowchart illustrating a method of detecting a battery cell having a low voltage defect according to an embodiment of the present invention. Referring to FIG. 2, a method of detecting a battery cell having a low voltage defect of the present invention includes: setting a reference time point when a voltage of a battery is stabilized after a shipping charge, and measuring a first voltage of a battery cell at the reference time point (S10); measuring a second voltage of the battery cell with a temporal interval longer than a period at which a self-discharge of the battery cell is suppressed (S20); and determining whether the battery cell has a low voltage defect by comparing a difference ($\Delta OCV$) between the first voltage and the second voltage with a reference value (S30), wherein the reference value is +3 sigma ($\sigma$) to +6 sigma ($\sigma$) in a normal distribution of a voltage drop amount obtained by the measuring of the first voltage and the measuring of the second voltage for a plurality of normal sample battery cell groups.

In the first step of measuring the first voltage, it is important to set the reference time point for measuring the first voltage. In this case, it is preferable to measure the first voltage at a time point when the battery cell is stabilized, as described above. The time point, at which the battery cell is stabilized, means a first time point at which the discharge restriction ($\Delta OCV$) starts to occur in a certain period as shown in the graph of FIG. 7, and is a time point after 168 hours from the start of the monitoring in the case of FIG. 7. Namely, the reference time point of the present invention means a time point at which discharge restriction starts to occur with a certain period.

The second step is a process of measuring the second voltage for calculating the voltage drop amount. In the present invention, the second voltage is measured with a time interval greater than the period in which the self-discharge is restricted from the reference time point. Referring to FIG. 8, the period, in which the self-discharge is restricted, is 24 hours, and if the second voltage is measured after a time interval greater than the period, the self-discharge restricting section is included. As such, the voltage drop amount becomes small, compared to a battery cell having a low voltage defect, which makes it easy to distinguish a good product from a defect product.

In one specific example, the second step of measuring the second voltage may be to measure the second voltage of the battery cell within 15 to 72 hours from the reference time point or within 18 to 45 hours from the reference time point. The numerical value range is merely an example and is not limited thereto. The numerical value range may be changed according to the battery capacity and material characteristics. Namely, the time point of measuring the second voltage may be a time point with a sufficient period in which the second voltage is restricted after a battery is stabilized from the reference time point, and is not limited to the above numerical value range.

In one specific example, during the measuring of the first voltage and the measuring of the second voltage, the voltages are measured using a voltage measuring instrument having resolution of microvolt units. Even if a voltage drop occurs by the self-discharge, the voltage drop amount is very small, and thus it is difficult to sense the voltage drop, and the discharge delay/restriction can be detected in the level of the fine voltage of microvolt units.

In one specific example, the first step of measuring the first voltage and the second step of measuring the second voltage may be performed at a temperature of 20° C. to 30° C.

The third step of determining whether a battery cell has a low voltage defect is a step of determining whether a battery cell has a low voltage defect by comparing the calculated voltage drop amount with the reference value. In particular, the present invention is characterized in setting the reference value in a statistical scheme. Hereinafter, the method of setting the reference value of the present invention will be described.

The method of deriving a reference value according to one embodiment of the present invention includes: a data construction step of measuring a fine voltage in microvolt units by a sample group and storing the measured values; and a reference value deriving step of deriving the reference value by processing data accumulated by the data construction step in a statistical scheme.

The data construction step includes the process of measuring the voltage according to the first step and the second step for good battery cells forming a sample group, calculating the voltage drop amount (ΔOCV) and accumulating the calculation result values as data. At this time, the number of objects of the sample group may be at least 100,000, preferably 200,000, and it is preferable to have as many objects of the sample group as possible in terms of reliability.

In the data construction step, the voltage is measured for sample group objects by using a fine voltage measuring instrument having the resolution of microvolt (uV) units.

The reference value deriving step is to derive the reference value by processing data accumulated by the data construction step in a statistical scheme. The statistical processing method according to an embodiment of the present invention is to obtain a normal distribution curve of the voltage drop amounts of objects of the sample group and determining +3 sigma (σ) to +6 sigma (σ) as the reference value.

Namely, the voltage drop amounts, which are derived from a large amount of good battery cells forming a sample group, form a normal distribution curve. Herein, objects having a large deviation in the normal distribution curve may be regarded as having a defect. As such, a predetermined deviation is determined as the reference value, and thus the reliability of the inspection result is further improved.

FIG. 8 shows an example of a distribution curve of voltage drop amounts of a sample group according to an embodiment of the present invention. Referring to FIG. 8, when the sample group shows a normal distribution curve as in FIG. 8, the majority of objects have values close to the average value (u), and the number of objects having a value, which is significantly deviated from the average value (u), is small. Therefore, objects having a value, which is significantly deviated from the average value, may be stochastically assumed as being defective. Specifically, the probability that an object having a deviation of 1σ (standard deviation) appears is about 32%, the probability that an object having a deviation of 2σ appears is about 5%, the probability that an object having a deviation of 3σ appears is about 0.3%, the probability that an object having a deviation of 4σ appears is about 0.01%, the probability that an object having a deviation of 5σ appears is about 0.001%, and the probability that an object having a deviation of 6σ appears is about 0.0000001%.

As such, in an embodiment of the present invention, the reference value may be set to the sum of the average value of the voltage drop amount and +3 sigma (σ) to +6 sigma (σ), and preferably the sum of the average value of the voltage drop amount and +4 sigma (σ) to +5 sigma (σ).

FIG. 3 shows a method of detecting a battery cell having a low voltage defect according to another embodiment of the present invention. Referring to FIG. 3, in the method of detecting a battery cell having a low voltage defect according to another embodiment of the present invention, the first step further includes a step of charging a first voltage after the shipping charge (S11).

If a fine current is charged to a battery cell after a shipping charge, the dispersion of good battery cells is further improved, thereby making the boundary between a good product and a defective product clearer.

FIG. 9 is a table showing the standard deviation of voltage drop amounts of defective battery cells and voltage drop amounts of good battery cells. Herein, the left side shows the state before performing the fine current application charge step, and the right side shows the state after performing the fine current application charge step. Referring to FIG. 9, when not performing the fine current charge, the standard deviation of voltage drop amounts of good products was 95 microvolts, but after performing the fine current charge, the standard deviation of voltage drop amounts of good products decreased to 39 microvolts. Further, the asterisk data in the top box show the voltage drop amounts of defective battery cells. When performing a fine current charge, the difference in the average values of voltage drop amounts of good battery cells and defective battery cells was 1180 microvolts, but when the fine current charge was not performed, the difference in the average values of voltage drop amounts of good battery cells and defective battery cells was 1131 microvolts. Namely, when performing the fine current charge, the difference between the voltage drop amount of a good product and the voltage drop amount of a defective product becomes large, and the standard deviation of the voltage drop amounts of good products becomes small, thereby making the distinction between good products and defective products clearer and improving the detection power.

In one specific example, during the charging of the fine current, a current of 50 to 150 mA may be applied in a CV charging scheme for 5 to 15 minutes. In the present invention, when applying fine voltage, the constant voltage charging scheme is employed because in the case of defective battery cells, cumulative charging current amount increases when the voltage is maintained due to leakage current at the constant voltage mode, and the voltage drop amount increases during rest time due to leakage current, thereby making it easy to distinguish a good product from a defective product.

Hereinafter, a method of manufacturing a lithium secondary battery according to the present invention will be described. A method of manufacturing a lithium secondary battery according to the present invention includes: activating an assembly-completed battery cell by injecting an electrolyte solution and sealing a battery container; and detecting a low voltage defect as described above while stabilizing the battery cell at a room temperature after a shipping charge.

In one specific example, the activating of the battery cell includes: forming the battery cell; aging the battery cell at a room temperature or a high temperature; discharging gas inside the battery cell; and performing a full charge and a full discharge.

The formation step is a step of forming a coating layer of SEI (solid electrolyte interface) of the negative electrode and is a step of charging the assembled secondary battery to a predetermined capacity (SOC). The SOC % may be 15 to 70%, preferably 30 to 65%, and more preferably 45 to 60%. In order to improve the dispersion by reducing the voltage drop of a good quality battery cell, the SEI film of the negative electrode should be formed uniformly and stably, which can be easily achieved when the volume of the negative electrode is expanded to the maximum during the formation process. In the formation process, as the charging is performed, lithium ions are inserted into a layer structure of a negative electrode, and stage 4 is stabilized to stage 1. At the primary charging step, a stable SEI layer may be formed only when charged until a time point when stage 2 is completed. Here, the charge point at which stage 2 is completed is different depending on the type of the negative electrode active material, but is generally at a level of SOC 45% to SOC 65%.

The charging conditions of the formation step may be performed according to a method known in the art. Specifically, charging may be performed with a charging voltage of 3.0 to 4.0V and a C-rate of 1.3 C or less. However, the charging voltage and the charging speed may vary according to the type or characteristics of the secondary battery, but are not limited thereto.

In one preferred embodiment of the present invention, in order to prevent a gas trap phenomenon and lithium plating in which gas generated during charging of the formation process is trapped between the electrode and the separator, It is preferable that the secondary battery is pressurized at the same time as charging in the formation step.

As described above, by pressurizing the secondary battery in the formation step, the SEI film is uniformly formed on the negative electrode, which has the advantage of maximizing the performance of the battery, such as capacity and resistance, and has the effect of shortening the charging and discharging time. The pressing may be performed using a jig or the like, but is not limited if it is a means capable of pressing the secondary battery.

Thereafter, an aging step of stabilizing the formed secondary battery is performed. The aging step is a step of further stabilizing the battery by maintaining at a constant temperature and humidity.

The aging step may include a high temperature aging step for aging in a high temperature environment of 60° C. or higher and/or a normal temperature aging step for stabilizing a secondary battery at a temperature of 20° C. to 30° C.

The high temperature aging step is a step of stabilizing the SEI film formed in the formation step above, which has an advantage that when the formed battery is aged at a high temperature rather than room temperature, the stabilization of the SEI film is further accelerated. For the purpose of the present invention to stabilize the SEI film to reduce the performance variation of the secondary battery, it is preferable to perform high temperature aging after the formation process.

In the present invention, the high-temperature aging step is performed at 60° C. or higher, preferably 65° C. to 75° C., thereby accelerating stabilization of the SEI film of good products and reducing the amount of self-discharge of good products to improve low voltage detection. When the high temperature aging is performed at a temperature of less than 60° C., it is difficult to achieve the object of the present invention, and when the temperature is too high, there is a problem that battery performance, such as capacity and life, is deteriorated, which is not desirable.

In one embodiment of the present invention, the high-temperature aging step may be performed for 18 hours to 36 hours, more preferably 21 hours to 24 hours. If the high temperature aging time is less than 18 hours, the stabilization of the SEI film may not be sufficient to achieve the object of the present invention, and when the high temperature aging time exceeds 36 hours, the aging time is prolonged, which is undesirable in terms of productivity.

The secondary battery in which the SEI film is stabilized by a high temperature aging can be subjected to room temperature aging to be stabilized at a room temperature. The room temperature aging step may be performed at 20° C. to 30° C., specifically 22° C. to 28° C., more specifically 23° C. to 27° C., and even more specifically 25° C. to 27° C.

The degassing process is for removing side reaction gases generated inside the secondary battery while going through the formation process and the aging step. In the degassing process, various degassing techniques known at the time of filing the present invention can be employed. For example, the degassing process may be performed by cutting an extended portion and sealing the cut portion in a pouch-type secondary battery having one side extended. However, since such a degassing technique is widely known to those skilled in the art, a more detailed description is omitted here.

The full charge and full discharge process is a process of completely charging and completely discharging the battery in order to activate the battery and sort out defective batteries. A shipping charge step is performed after a full-charging and full-discharging process. The shipping charge step is a step of charging the battery for shipping after the product is completely discharged. A low voltage defect for a shipping-charge completed secondary battery is detected through a step of measuring a change in a voltage value. In this case, a method of detecting a low voltage defect of the present invention may be applied.

In a method of manufacturing a secondary battery according to an embodiment of the present invention, before performing the formation process, a pre-aging step of aging the assembled secondary battery under constant temperature and humidity conditions may be performed.

First, in the pre-aging step, an electrode mixture including an electrode active material and a binder is applied to an electrode current collector to prepare a positive electrode and a negative electrode, respectively, and then an electrode assembly is prepared by interposing a separator between the positive electrode and the negative electrode.

After the electrode assembly thus prepared is accommodated in a battery case, an electrolyte is injected, and the battery case is sealed to manufacture a battery.

The step of manufacturing such a battery is not particularly limited and can be performed according to a known method.

In addition, the electrode assembly is not particularly limited as long as it is a structure including a positive electrode, a negative electrode, and a separator interposed between the positive electrode and the negative electrode, and may be, for example, a jelly-roll type, a stack type, or a stack/folding type.

The battery case is not particularly limited as long as it is used as an exterior material for packaging the battery, and a cylindrical, square, or pouch type may be used.

The electrolyte includes an organic solvent and a lithium salt, and may optionally further contain an additive.

The organic solvent is not limited as long as decomposition by an oxidation reaction or the like during charging and discharging of the battery can be minimized, and may be, for example, cyclic carbonate, linear carbonate, ester, ether, or ketone. These may be used alone, or two or more of them may be used in combination.

Among the organic solvents, carbonate-based organic solvents can be preferably used. Examples of cyclic carbonates include ethylene carbonate (EC), propylene carbonate (PC) and butylene carbonate (BC). Linear carbonates include dimethyl carbonate (DMC), diethyl carbonate (DEC), dipropyl carbonate (DPC), ethyl methyl carbonate (EMC), methylpropyl carbonate (MPC), and ethylpropyl carbonate (EPC).

Lithium salts commonly used in electrolytes of lithium secondary batteries such as $LiPF_6$, $LiAsF_6$, $LiCF_3SO_3$, $LiN(CF_3SO_2)_2$, $LiBF_4$, $LiBF_6$, $LiSbF_6$, $LiN(C_2F_5SO_2)_2$, $LiAlO_4$, $LiAlCl_4$, $LiSO_3CF_3$ and $LiClO_4$, etc. can be used for the lithium salt without limitation, and these can be used alone, two or more can be used in combination.

In addition, the electrolyte may optionally further include an additive. Any one or a mixture of two or more selected from a group consisting of vinylene carbonate, vinylethylene carbonate, fluoroethylene carbonate, cyclic sulfite, saturated sultone, unsaturated sultone, acyclic sulfone, lithium oxalyl difluoroborate (LiODFB), and derivatives thereof may be used as the additive in order to stably form an SEI film, but not limited thereto.

The cyclic sulfite may include ethylene sulfite, methyl ethylene sulfite, ethyl ethylene sulfite, 4,5-dimethyl ethylene sulfite, 4,5-diethyl ethylene sulfite, propylene sulfite, 4,5-dimethyl propylene sulfite, 4,5-diethyl propylene sulfite, 4,6-dimethyl propylene sulfite, 4,6-diethyl propylene sulfite, 1,3-butylene glycol sulfite, etc. Saturated sultone may include 1,3-propane sultone and 1,4-butane sultone, etc. Unsaturated sultone may include ethene sultone, 1,3-propene sultone, 1,4-butene sultone, and 1-methyl-1,3-propene sultone. The acyclic sulfone may include divinyl sulfone, dimethyl sulfone, diethyl sulfone, methylethyl sulfone, and methylvinyl sulfone.

These additives are added to the electrolyte to improve low temperature output characteristics by forming a solid SEI film on the negative electrode, as well as to suppress decomposition of the positive electrode surface and prevent oxidation reaction of the electrolyte during high temperature cycle operation.

When the battery case is of a pouch type, an aluminum laminated pouch including an aluminum layer may be used. After the electrolyte is injected, the opened portion of the aluminum laminated pouch can be sealed by heat welding.

In the pre-aging step, wetting of the battery by the electrolyte injected is performed.

More specifically, when the secondary battery is charged, if the electrons move to the negative electrode and charged, lithium ions are intercalated to the negative electrode to achieve charge neutrality. At this time, lithium ions can be occluded at the site where the electrolyte is impregnated, that is, where the ion migration path is maintained (wetting area), but occlusion is relatively difficult at the electrolyte non-wetting area.

Therefore, through the pre-aging step,
the battery can be aged for 0.5 to 72 hours at room temperature and atmospheric pressure so that the electrolyte can be permeated into the positive and negative electrodes. For example, the pre-aging step may be performed at 20° C. to 30° C., specifically 22° C. to 28° C., more specifically 23° C. to 27° C., and even more specifically 25° C. to 27° C.

The above description is merely illustrative of the technical idea of the present invention, and those skilled in the art to which the present invention pertains may make various modifications and variations without departing from the essential characteristics of the present invention. Therefore, the drawings disclosed in the present invention are not intended to limit the technical idea of the present invention but to describe the present invention, and the scope of the technical idea of the present invention is not limited by these drawings. The scope of protection of the present invention should be interpreted by the following claims, and all technical ideas within the scope equivalent thereto should be construed as being included in the scope of the present invention.

The invention claimed is:

1. A method of detecting a low voltage defect, the method comprising:
setting a reference time point when a voltage of a battery is stabilized after a shipping charge, and measuring a first voltage of a battery cell at the reference time point, wherein the reference time point is a time point at which discharge delay starts to occur periodically;
measuring a second voltage of the battery cell with a temporal interval longer than a period at which a self-discharge of the battery cell is suppressed; and
determining whether the battery cell has the low voltage defect by comparing a difference ($\Delta$OCV) between the first voltage and the second voltage with a reference value,
wherein the reference value is +3 sigma ($\sigma$) to +6 sigma ($\sigma$) in a normal distribution of a voltage drop amount obtained by measuring the first voltage and measuring the second voltage for a plurality of sample battery cells.

2. The method of claim 1, wherein the reference value is +4 sigma ($\sigma$) to +5 sigma ($\sigma$) in the normal distribution of the voltage drop amount.

3. The method of claim 1, wherein the first and second voltages of the battery cell are measured using a voltage measuring instrument having a resolution of microvolt units.

4. The method of claim 1, wherein the measuring of the first voltage of the battery cell further includes applying a current of 50 to 150 mA after the shipping charge.

5. The method of claim 4, wherein the current of 50 to 150 mA is applied in a CV charging scheme for 5 to 15 minutes.

6. The method of claim 1, wherein the measuring of the second voltage of the battery cell includes measuring the second voltage of the battery cell within 15 to 72 hours from the reference time point.

7. The method of claim 6, wherein the measuring of the second voltage of the battery cell includes measuring the second voltage of the battery cell within 18 to 45 hours from the reference time point.

8. The method of claim 1, wherein the measuring of the first voltage of the battery cell and the measuring of the second voltage of the battery cell are performed at a temperature of 20 to 30° C.

9. A method of manufacturing a lithium secondary battery, the method comprising:
activating an assembly-completed battery cell by injecting an electrolyte solution and sealing a battery container; and
detecting the low voltage defect including performing the method of claim 1 while stabilizing the battery cell at a room temperature after the shipping charge.

10. The method of claim 9, wherein the activating of the assembly-completed battery cell includes:
forming the battery cell;
aging the battery cell at the room temperature or a high temperature;
discharging gas inside the battery cell; and
performing a full charge and a full discharge.

11. A method of detecting a low voltage defect, the method comprising:
setting a reference time point when a voltage of a battery is stabilized after a shipping charge, and after the shipping charge, applying a current of 50 to 150 mA in a CV charging scheme for 5 to 15 minutes and measuring, at the reference time point, a first voltage of a battery cell,
measuring a second voltage of the battery cell with a temporal interval longer than a period at which a self-discharge of the battery cell is suppressed; and determining whether the battery cell has the low voltage defect by comparing a difference (ΔOCV) between the first voltage and the second voltage with a reference value, wherein the reference value is +3 sigma (σ) to +6 sigma (σ) in a normal distribution of a voltage drop amount obtained by measuring the first voltage and measuring the second voltage for a plurality of sample battery cells.

12. The method of claim 11, wherein the reference value is +4 sigma (σ) to +5 sigma (σ) in the normal distribution of the voltage drop amount.

13. The method of claim 11, wherein the first and second voltages of the battery cell are measured using a voltage measuring instrument having a resolution of microvolt units.

14. The method of claim 11, wherein the measuring of the second voltage of the battery cell includes measuring the second voltage of the battery cell within 15 to 72 hours from the reference time point.

15. The method of claim 13, wherein the measuring of the second voltage of the battery cell includes measuring the second voltage of the battery cell within 15 to 72 hours from the reference time point.

16. The method of claim 14, wherein the measuring of the second voltage of the battery cell includes measuring the second voltage of the battery cell within 18 to 45 hours from the reference time point.

17. The method of claim 11, wherein the measuring of the first voltage of the battery cell and the measuring of the second voltage of the battery cell are performed at a temperature of 20 to 30° C.

18. The method of claim 15, wherein the reference time point is a time point at which discharge delay starts to occur periodically.

19. A method of detecting a low voltage defect, the method comprising:

setting a reference time point when a voltage of a battery is stabilized after a shipping charge, and after the shipping charge, applying a current of 50 to 150 mA and measuring, at the reference time point, a first voltage of a battery cell, measuring a second voltage of the battery cell with a temporal interval longer than a period at which a self-discharge of the battery cell is suppressed; and determining whether the battery cell has the low voltage defect by comparing a difference (ΔOCV) between the first voltage and the second voltage with a reference value, wherein the reference value is +3 sigma (σ) to +6 sigma (σ) in a normal distribution of a voltage drop amount obtained by measuring the first voltage and measuring the second voltage for a plurality of sample battery cells.

* * * * *